United States Patent
Fimland et al.

(10) Patent No.: US 11,261,537 B2
(45) Date of Patent: *Mar. 1, 2022

(54) III-V OR II-VI COMPOUND SEMICONDUCTOR FILMS ON GRAPHITIC SUBSTRATES

(71) Applicant: NORWEGIAN UNIVERSITY OF SCIENCE AND TECHNOLOGY (NTNU), Trondheim (NO)

(72) Inventors: Bjørn-Ove Fimland, Trondheim (NO); Dheeraj L. Dasa, Flatåsen (NO); Helge Weman, Ecublens (CH)

(73) Assignee: Norwegian University of Science and Technology (NTNU), Trondheim (NO)

( * ) Notice: Subject to any disclaimer, the term of this patent is extended or adjusted under 35 U.S.C. 154(b) by 45 days.

This patent is subject to a terminal disclaimer.

(21) Appl. No.: 16/679,832

(22) Filed: Nov. 11, 2019

(65) Prior Publication Data

US 2020/0141027 A1 May 7, 2020

Related U.S. Application Data

(63) Continuation of application No. 14/900,267, filed as application No. PCT/EP2014/063195 on Jun. 23, 2014, now Pat. No. 10,472,734.

(30) Foreign Application Priority Data

Jun. 21, 2013 (GB) .................... 1311101

(51) Int. Cl.
*C30B 25/10* (2006.01)
*C30B 25/18* (2006.01)
(Continued)

(52) U.S. Cl.
CPC .......... *C30B 25/105* (2013.01); *C30B 25/183* (2013.01); *C30B 29/02* (2013.01);
(Continued)

(58) Field of Classification Search
None
See application file for complete search history.

(56) References Cited

U.S. PATENT DOCUMENTS

| 4,213,801 A | 7/1980 | Johnston |
| 7,335,908 B2 | 2/2008 | Samuelson et al. |

(Continued)

FOREIGN PATENT DOCUMENTS

| CN | 101504961 A | 8/2009 |
| CN | 101710567 A | 5/2010 |

(Continued)

OTHER PUBLICATIONS

Communication pursuant to Article 94(3) EPC dated Feb. 23, 2017, from European Patent Application No. 14731971.9, 5 pages.
(Continued)

*Primary Examiner* — Nicole M. Buie-Hatcher
(74) *Attorney, Agent, or Firm* — Meunier Carlin & Curfman LLC

(57) ABSTRACT

A composition of matter comprising a film on a graphitic substrate, said film having been grown epitaxially on said substrate, wherein said film comprises at least one group III-V compound or at least one group II-VI compound.

15 Claims, 5 Drawing Sheets

(51) Int. Cl.

| | |
|---|---|
| *C30B 29/40* | (2006.01) |
| *C30B 29/48* | (2006.01) |
| *H01L 21/02* | (2006.01) |
| *H01L 29/15* | (2006.01) |
| *H01L 29/20* | (2006.01) |
| *H01L 29/22* | (2006.01) |
| *C30B 29/02* | (2006.01) |
| *H01L 29/04* | (2006.01) |
| *H01L 29/16* | (2006.01) |

(52) U.S. Cl.
CPC .............. *C30B 29/40* (2013.01); *C30B 29/48* (2013.01); *H01L 21/02376* (2013.01); *H01L 21/02455* (2013.01); *H01L 21/02466* (2013.01); *H01L 21/02469* (2013.01); *H01L 21/02485* (2013.01); *H01L 21/02538* (2013.01); *H01L 21/02551* (2013.01); *H01L 21/02631* (2013.01); *H01L 29/045* (2013.01); *H01L 29/151* (2013.01); *H01L 29/16* (2013.01); *H01L 29/1606* (2013.01); *H01L 29/20* (2013.01); *H01L 29/22* (2013.01)

(56) References Cited

U.S. PATENT DOCUMENTS

| | | | |
|---|---|---|---|
| 7,442,575 B2 | 10/2008 | Coffer et al. | |
| 7,594,982 B1 | 9/2009 | Sager et al. | |
| 7,608,147 B2 | 10/2009 | Samuelson et al. | |
| 7,608,472 B2 | 10/2009 | Ichinose et al. | |
| 7,911,035 B2 | 3/2011 | Seifert et al. | |
| 7,965,960 B2 | 6/2011 | Kim et al. | |
| 8,043,942 B2 | 10/2011 | Lee et al. | |
| 8,212,335 B2 | 7/2012 | Fujioka | |
| 8,417,153 B2 | 4/2013 | Kim et al. | |
| 8,440,350 B1 | 5/2013 | Verbrugge et al. | |
| 9,577,176 B1 | 2/2017 | Fong et al. | |
| 9,666,673 B2 | 5/2017 | Yi et al. | |
| 10,243,104 B2 | 3/2019 | Weman et al. | |
| 10,472,734 B2 * | 11/2019 | Fimland | H01L 29/045 |
| 10,957,816 B2 * | 3/2021 | Bayram | H01L 33/14 |
| 2002/0175408 A1 | 11/2002 | Majumdar et al. | |
| 2003/0044608 A1 | 3/2003 | Yoshizawa et al. | |
| 2004/0075464 A1 | 4/2004 | Samuelson et al. | |
| 2006/0125056 A1 | 6/2006 | Samuelson et al. | |
| 2006/0188774 A1 | 8/2006 | Niu et al. | |
| 2007/0177138 A1 | 8/2007 | Esmaeili | |
| 2007/0177139 A1 | 8/2007 | Kamins et al. | |
| 2007/0212538 A1 | 9/2007 | Niu | |
| 2008/0036038 A1 | 2/2008 | Hersee et al. | |
| 2008/0081439 A1 | 4/2008 | Coffer et al. | |
| 2008/0142066 A1 | 6/2008 | Plissonnier et al. | |
| 2008/0142926 A1 | 6/2008 | Seifert et al. | |
| 2008/0191317 A1 | 8/2008 | Cohen et al. | |
| 2009/0057649 A1 | 3/2009 | Sutter et al. | |
| 2009/0159907 A1 | 6/2009 | Wang | |
| 2009/0176159 A1 | 7/2009 | Zhamu et al. | |
| 2009/0191317 A1 | 7/2009 | Lin | |
| 2009/0200540 A1 | 8/2009 | Bjoerk et al. | |
| 2009/0235862 A1 | 9/2009 | Cha et al. | |
| 2009/0293946 A1 | 12/2009 | Lin et al. | |
| 2010/0029037 A1 | 2/2010 | Tokuda et al. | |
| 2010/0035412 A1 | 2/2010 | Samuelson et al. | |
| 2010/0155702 A1 | 6/2010 | Wernersson et al. | |
| 2010/0171096 A1 | 7/2010 | Sutter et al. | |
| 2010/0252808 A1 | 10/2010 | Samuelson et al. | |
| 2010/0314617 A1 | 12/2010 | Ito et al. | |
| 2010/0320445 A1 | 12/2010 | Ogihara et al. | |
| 2010/0327258 A1 | 12/2010 | Lee et al. | |
| 2011/0030991 A1 | 2/2011 | Veerasamy et al. | |
| 2011/0121264 A1 | 5/2011 | Choi et al. | |
| 2011/0129675 A1 | 6/2011 | Choi et al. | |
| 2011/0133061 A1 | 6/2011 | Yu et al. | |
| 2011/0148284 A1 | 6/2011 | Nagao et al. | |
| 2011/0163292 A1 | 7/2011 | Wang et al. | |
| 2011/0168256 A1 | 7/2011 | Wang et al. | |
| 2011/0174626 A1 | 7/2011 | Hamada et al. | |
| 2011/0175059 A1 | 7/2011 | Kahen et al. | |
| 2011/0177683 A1 | 7/2011 | Kahen et al. | |
| 2011/0203651 A1 | 8/2011 | Nagao et al. | |
| 2011/0220171 A1 | 9/2011 | Mathai et al. | |
| 2011/0220864 A1 | 9/2011 | Kim et al. | |
| 2011/0239932 A1 | 10/2011 | Chang et al. | |
| 2011/0240099 A1 | 10/2011 | Ellinger et al. | |
| 2011/0254034 A1 | 10/2011 | Konsek et al. | |
| 2011/0272723 A1 | 11/2011 | Ha et al. | |
| 2011/0313194 A1 | 12/2011 | Lee et al. | |
| 2012/0021554 A1 | 1/2012 | Neel et al. | |
| 2012/0041246 A1 | 2/2012 | Scher et al. | |
| 2012/0056237 A1 | 3/2012 | Choi et al. | |
| 2012/0068122 A1 | 3/2012 | Kranbuehl et al. | |
| 2012/0068153 A1 | 3/2012 | Seong et al. | |
| 2012/0068157 A1 | 3/2012 | Kub et al. | |
| 2012/0090057 A1 | 4/2012 | Cohen et al. | |
| 2012/0132930 A1 | 5/2012 | Young et al. | |
| 2012/0135158 A1 | 5/2012 | Freer et al. | |
| 2012/0141799 A1 | 6/2012 | Kub et al. | |
| 2012/0145549 A1 | 6/2012 | Cho et al. | |
| 2012/0187422 A1 | 7/2012 | Fujioka et al. | |
| 2012/0192931 A1 | 8/2012 | Jeon et al. | |
| 2012/0241192 A1 | 9/2012 | Cai et al. | |
| 2012/0270054 A1 | 10/2012 | Hong et al. | |
| 2013/0158322 A1 | 6/2013 | Nyce et al. | |
| 2013/0187128 A1 | 7/2013 | Yi et al. | |
| 2013/0213470 A1 | 8/2013 | Yi et al. | |
| 2013/0221322 A1 | 8/2013 | Ohlsson et al. | |
| 2013/0221385 A1 | 8/2013 | Shibata et al. | |
| 2013/0231470 A1 | 9/2013 | Iacobelli | |
| 2013/0280894 A1 | 10/2013 | Lee et al. | |
| 2013/0311363 A1 | 11/2013 | Ramaci | |
| 2013/0334497 A1 | 12/2013 | Weman et al. | |
| 2014/0151826 A1 | 6/2014 | Keiber et al. | |
| 2014/0161730 A1 | 6/2014 | Sitharaman et al. | |
| 2014/0182668 A1 | 7/2014 | Pacifici et al. | |
| 2014/0252316 A1 | 9/2014 | Yan et al. | |
| 2014/0293164 A1 | 10/2014 | Kim et al. | |
| 2015/0014631 A1 | 1/2015 | Ohlsson et al. | |
| 2015/0076450 A1 | 3/2015 | Weman et al. | |
| 2015/0194549 A1 | 7/2015 | Fimland et al. | |
| 2015/0255677 A1 | 9/2015 | Dechoux et al. | |
| 2015/0311363 A1 | 10/2015 | Park et al. | |
| 2016/0005751 A1 | 1/2016 | Tsui et al. | |
| 2016/0197206 A1 | 7/2016 | Lim et al. | |

FOREIGN PATENT DOCUMENTS

| | | |
|---|---|---|
| CN | 102254969 A | 11/2011 |
| CN | 102376817 A | 3/2012 |
| CN | 101952984 B | 8/2012 |
| CN | 103050498 A | 4/2013 |
| EP | 2246910 A1 | 11/2010 |
| EP | 2476787 A1 | 7/2012 |
| JP | 2012250868 A | 12/2012 |
| JP | 2014120548 A | 6/2014 |
| KR | 20100094228 A | 8/2010 |
| KR | 20110061492 A | 6/2011 |
| KR | 20120035841 A | 4/2012 |
| KR | 20120083084 A | 7/2012 |
| KR | 20120092431 A | 8/2012 |
| KR | 101217216 B1 | 12/2012 |
| KR | 101517551 B1 | 5/2015 |
| WO | 2007061945 A2 | 5/2009 |
| WO | 2010056064 A2 | 5/2010 |
| WO | 2010096035 A1 | 8/2010 |
| WO | 2011090863 A1 | 7/2011 |
| WO | 2011125277 A1 | 10/2011 |
| WO | 2012029381 A1 | 3/2012 |
| WO | 2012080252 A1 | 6/2012 |

(56) References Cited

FOREIGN PATENT DOCUMENTS

| WO | WO-2013106411 A1 * | 7/2013 | ......... H01L 21/3065 |
| WO | 2014202796 A1 | 12/2014 | |

OTHER PUBLICATIONS

Nanocomposite Thin Films and Coatings-Processing, Properties, Performance, Table 2.1. The Physical, Mechanical and Thermal Properties of Hard Materials, 2007, World Scientific.

Chung, K. et al., "Supporting Online Material for Transferable GaN Layers Grown on ZnO-Coated Graphene Layers for Optoelectronic Devices", Science, vol. 330, No. 6004, Oct. 28, 2010 (Oct. 28, 2010), XP055331517, ISSN: 0036-8075, DOI: 10.1126/science. 1195403, 12 pages.

Chung, K. et al., "Transferrable GaN Layers Grown on ZnO-Coated Graphene Layers for Optoelectronic Devices", Science, vol. 330, No. 6004, Oct. 29, 2010 (Oct. 29, 2010), pp. 655-657, XP055331577, ISSN: 0036-8075, DOI:10.1126/science.1195403.

Chung et al. High-quality GaN films grown on chemical vapor-deposited graphene films, NPG Asia Materials, Sep. 7, 2012, vol. 4, No. e24, pp. 1-5.

Hong, et al., "Controlled can der Waals Heteroepitaxy of InAs Nanowires on Carbon Honeycomb Lattices", ACS Nano, 2011, 5(9), 7576-7584.

Jiang, Yeping et al., "Fermi-Level Tuning of Epitaxial Sb2Te3 Thin Films on Graphene by Regulating Intrinsic Defects and Substrate Transfer Doping", Physical Review Letters, 2012, 108:066809.

Munshi, et al., "Vertically aligned GaAs nanowires on graphite and few-layer graphene: Generic model epitaxial growth", Nano Letters 2012, 12(9): 4570-4573.

Park, et al., "Hybrid Semiconductor Nanostructures with Graphene Layers", 2012, Chapter 6.

Park, et al., "Inorganic nanostructures grown on graphene layers", Nanoscale, 3, 3522, 2011.

International Search Report and Written Opinion issued for Application No. PCT/EP2014/063195 dated Oct. 10, 2014 from the European Searching Authority.

Mrojanadara, et al., "Large homogeneous mono-/bi-ayer graphene on 6H-SiC (0001) and buffer layer elimination", J Phys D: Appl Phys. 2010, 43, 374010.

Yoo, et al., "Microstructural defects in GaN thin films grown on chemically vapor-deposited graphene layers", Applied Physics Letters 2013, 102 (5): 051908-1-051908-3.

Bonaccorsco, et al., "Graphene photonics and optoelectronics", Nature Photonics, 2010, 4, 611.

Boukhvalov, et al., "Chemical functionalization of graphene with defects", Nano Letters, 2008, 8(12), 4373-4379.

Cohin, et al., "Growth of Vertical GaAs Nanowires or an Amorphous Substrate via a Fiber-Textured Si Platform", Nano Letters, 2013, 2743.

Colombo, et al., "Ga-assisted catalyst-free growth mechanism of GaAs nanowires by molecular beam epitaxy", Phys Rev B, 2008, 77, 155326.

Dheeraj, D L., "Controlling Crystal Phases in GaAs Nanowires Grown by Au-assisted Molecule Beam Epitaxy".

Gao, et al. "Repeated growth and bubbling transfer of graphene with millimetre-size single-crystal grains using platinum", Nat Commun 2012, 3, 699.

Heib, et al., "Growth mechanisms and optical properties of GaAs-based semiconductor microstructures by selective area epitaxy", Journal of Crystal Growth, 2008, 310, 1049-1056.

Huh, et al., "UV/Ozone-Oxidized Large-Scale Graphene Platform with Large Chemical Enhancement in Surface-Enhanced Raman Scattering", ACS Nano, 2011, 5(12), 9799-9806.

Kent, et al., "Deep ultraviolet emitting polarization induced nanowire Tight emitting diodes with AlxGa(1-x)N active regions", Nanotechnology, 2014, 25, 455201.

Kim, et al., "Realization of a high mobility dual-gated graphene field-effect transistor with Al2O3 dielectric", Appl. Phys. Lett. 2009, 94, 062107.

Kim, et al., "Vertically aligned ZnO nanostructures grown on graphene Tayers", Applied Physics Letters, 2009, 95, 213101-1 through 213101-3.

Kishino et al., "Improved Ti-mask selective-area growth (SAG) by rf-plasma-assisted molecular beam epitaxy demonstrating extremely uniform GaN nanocolumn arrays", J. Crystal Growth 2009, 311, 2063-68.

Kneissl, et al., "Advances in group III-nitride-based deep UV lightemitting diode technology", Semiconductor Sci and Tech, 2011, 26, 014036.

Marzouki, et al., "Structural and optical characterizations of nitrogen-doped ZNO nanowires grown by MOCVD", Materials Letters 64, 2010, 2112-2114.

Mohseni, et al., "Hybrid GaAs-Nanowire Carbon-Nanotube Flexible Photovoltaics", IEEE Journal of Selected Topics in Quantum Electronics, 201, 17(4), 1070-1077.

Mulyana, et al., "Reversible Oxidation of Graphene Through Ultraviolet/Ozone Treatment and Its Nonthermal Reduction through Ultraviolet Irradiation", J Phys Chem C, 2014, 118(47), 27372-27381.

Musolino, et al., "Compatibility of the selective area growth of GaN nanowires on AlN-buffered Si substrates with the operation of light emitting diodes", Nanotechnology 2015, 26, 085605.

Nevidomskyy, et al. "Chemically active substitutional nitrogen impurity in carbon nanotubes", Phys Rev Lett, 91, 105502.

Paek, et al., "MBE-VLS growth of GaAs nanowires on (111)Si substrate", Physica Status Solidi (C), 2008, 5(9), 2740-2742.

Patsha, et al., "Growth of GaN nanostructures on graphene", Nanoscience, 2011 International Conference on Engineering and Technology (ICONSET), pp. 553-555.

PCT/EP2016/006696, "International Search Report and Written Opinion dated Oct. 14, 2016 in related application PCT/EP2016/006696 (11 pages)".

PCT/EP2016/066694, "International Search Report and Written Opinion dated Oct. 19, 2016 in related application PCT/EP2016/066694 (13 pages)".

PCT/EP2016/068350, "International Search Report and Written Opinion dated Jan. 11, 2017 in related application PCT/EP2016/068350 (16 pages)".

Pela, et al. "Accurate band gaps of AlGaN, InGaN, and AlInN alloys calculations based on LDA-1/2 approach", Appl Phys Lett, 2011, 98, 151907.

Peng, et al., "Control of growth orientation of GaN nanowires", Chemical Physics Letters, 2002, 359, 241-245.

Pierret, et al., "Generic nano-imprint process for fabrication of nanowire arrays", Nanotechnology, 21(6), 2010, 065305.

Plissard, et al., "Gold-free growth of GaAs nanowires on silicon: arrays and polytypism", Nanotechnology, 2010, 21, 1-8.

Plissard, et al., "High yield of self-catalyzed GaAs nanowire arrays grown on silicon via gallium droplet positioning", Nanotechnology, 2011, 22, 275602.

Sun, et al., "Compound Semiconductor Nanowire Solar Cells", IEEE Journal of Selected Topics in Quantum Electronics, 2011, 17)(4), 1033-1049.

Toko, et al., "Selective formation of large-grained (100)- or (111)-oreinted Si on glass by Al-induced layer exchange", J Appl Phys, 2014, 115, 094301.

Tomioka, et al., "Control of InAs Nanowire Growth Directions on Si", Nano Letters, 2008, 8(10), 3475-3480.

Wang, et al., "Growth of Nanowires", Materials Science and Engineering, 2008, 60, 1-51.

Wang, et al., "Nanocrystal growth on graphene in various degrees of oxidation", Journal of American Chemical Society, 2010, 132, 3270-3271.

Yamaguchi, et al., "Passivating chemical vapor deposited graphene with metal oxides for transfer and transistor fabrication processes", Appl Phys Lett, 2013, 102, 143505.

Yin, et al., "Application of CVD graphene as transparent front electrode in Cu(In, GA)Se2 solar cell", 2014 IEEE 40th Photovoltaic Specialist Conference (PVSC), pp. 1740-1744, XP032660257.

(56) References Cited

OTHER PUBLICATIONS

Yoon, et al., "Vertical epitaxial Co5Ge7 nanowires and nanobelt arrays on a thin graphitic layer for flexible Field Emission Displays", Advanced Materials, 2009, 21, 4979-4982.
Yu, et al., "Electronic properties of nitrogen-atom-adsorbed graphene nanoribbons with armchair edges", IEEE transactions on Nanotechnology, 2010, 9(2).
Zhao, et al., "Aluminum nitride nanowire light emitting diodes: Breaking the fundamental bottleneck of deep ultraviolet light sources", Scientific Reports, 2015, 5, 8332.
Mariani et al. Patterned Radial GaAs Nanopillar Solar Cells, Nano Letters, 2011, 11, 2490-2494.
Nistor et al. The Role of Chemistry in Graphene Doping for Carbon-Based Electronics. ACS Nano, 2011, 5(4), 3096-3103.

* cited by examiner

FIG. 5  SbGp13 300'C
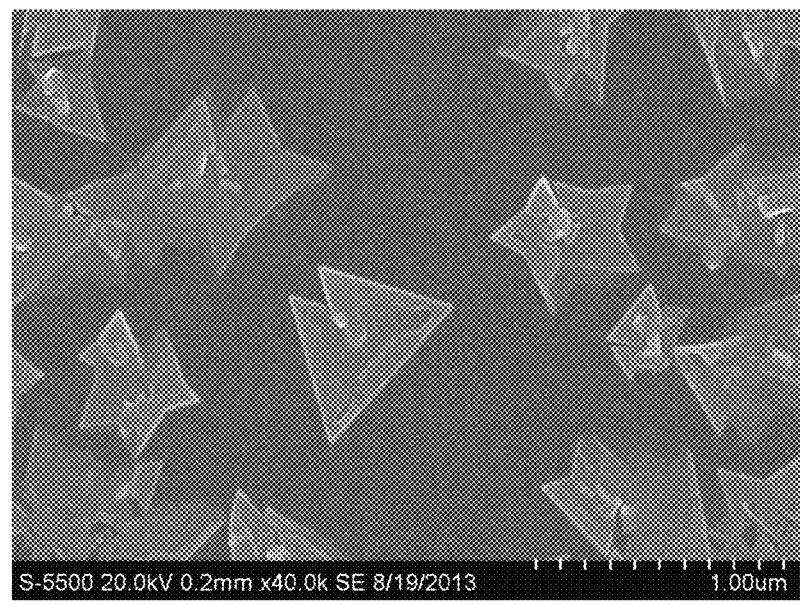

III-V OR II-VI COMPOUND SEMICONDUCTOR FILMS ON GRAPHITIC SUBSTRATES

This invention concerns a process for growing thin films epitaxially on graphitic substrates. In particular, the invention employs molecular beam epitaxy techniques to grow semiconducting thin films epitaxially on graphitic substrates. The resulting graphite supported semiconducting films form a further aspect of the invention. The films are preferably semiconductor materials and have wide ranging applications in, for example, the electronics industry or in solar cell applications.

Over recent years, the interest in semiconductors has intensified as nanotechnology becomes an important engineering discipline. Semiconductor technology has found important applications in a variety of electrical devices such as sensors, solar cells and LED's.

Many different types of semiconductors are known, some in film form. Conventionally, semiconductor films have been grown on a substrate identical to the semiconductor itself (homoepitaxial growth) Thus, GaAs was grown on GaAs, Si on Si etc. This, of course, ensures that there is a lattice match between the crystal structure of the substrate and the crystal structure of the growing semiconductor. Both substrate and semiconductor can have identical crystal structures.

Using the same material as a substrate is, however, also highly limiting. Also, the necessary substrate materials may be expensive. It is also normal to require the substrate to be cut to expose a particular plane within the crystal structure of the substrate such as the (001) plane or the (111) plane. That can be difficult and adds to the expense of the substrate.

However, with the introduction of ternary semiconductors, a lattice match on binary substrates such as GaAs, GaSb and InP could be achieved by tuning the composition of the ternary, quaternary, etc semiconductor. This therefore represents heteroepitaxial growth as the substrate and the growing film are different.

Also the growth of pseudomorphic epilayers is known. In the pseudomorphic epilayer there is a small strain (of the order of 1%) in the epilayer due to a lattice mismatch (of the order of 1%) between the epilayer and substrate. Pseudomorphic epilayers can only be grown defect free up to a certain thickness, called the "critical thickness", above which the pseudomorphic epilayer starts to "relax". During relaxation, dislocations are introduced in the epilayer in order to reduce the strain energy in the layer. These dislocation rich layers are of limited interest as semiconductors.

One way of compensating for the strain in the epilayer has been to grow "strained-layer superlattices". These strained-layer superlattices comprise alternating epilayers of two or more materials with different equilibrium lattice constants which compensate each others strain. Thus, layers with alternating compressive and tensile strain can be grown. In certain cases, these strained-layer superlattices can be grown very thick since the average lattice constant of the superlattice as a whole can be tailored to match the lattice constant of the substrate.

However, the necessary substrate materials for heteroepitaxial growth may not be readily available and they may again be expensive.

The present inventors therefore sought other substrate materials on which to grow semiconductor thin films, in particular, cheap substrates that are economically viable on an industrial scale. The present inventors sought to use graphitic substrates to carry semiconductor thin films, in particular graphene.

Perfect graphene is a one-atom-thick planar sheet of $sp^2$-bonded carbon atoms that are densely packed in a honeycomb crystal lattice. The crystalline or "flake" form of graphite consists of many graphene sheets stacked together. Graphene has attracted a lot of interest recently due to its advantageous properties. It is light, transparent and yet very strong and electrically conducting. Its use as a support for a semiconducting thin film would therefore be very attractive.

In Jiang et al. Physical Review Letters 10 Feb. 2012, $Sb_2Te_3$ thin films on graphene are taught. These films are grown by molecular beam epitaxy and are semiconductors due to intrinsic defects within the film or from inherited dopants from the graphene substrate.

The present inventors, however, sought the formation of group (III)/(V) or (II)/(VI) semiconductors of completely different structure to $Sb_2Te_3$. $Sb_2Te_3$ has no lone pairs so has no interlayer adhesion. Like graphite therefore, it is flaky and with only very weak van der Waals forces holding one layer of the crystal structure to the next layer. It is a "2-dimensional" material. Carrying a thin film of $Sb_2Te_3$ offers very different challenges to depositing a thin film of a semiconductor of this invention which have lone pairs available for interlayer bonding and for interacting with the substrate. The semiconductors of the present invention are therefore "3-dimensional".

The present invention relates to "3-dimensional" materials as the semi-conductors of the present invention have free lone pairs and interatomic bonding. When growing a "3-dimensional" crystal film on a substrate, it is essential for there to be a lattice match between the substrate and the semiconductor in order to form a single crystal film of high structural, electronic and optical quality suitable for applications. Without this lattice match, a useful film does not form. For the present invention therefore lattice matching is essential where for $Sb_2Te_3$ it is irrelevant.

Since graphitic substrates have no lone pairs at the surface and very short atomic bond length compared with typical semiconductors like silicon and GaAs, there is no reason to anticipate nucleation and epitaxial growth of films thereon. As surprisingly noted below, the present inventors have realized that there is an excellent lattice match possible between a graphitic substrate and some semiconductors depending on how the semiconductor atoms are positioned on the surface of graphene. Alternatively, there is a close lattice match possible between a suitable group (II), (III), (V) or (VI) elements and the graphitic substrate.

With a lattice match present, the use of molecular beam epitaxy offers excellent results in terms of film growth. The inventors have surprisingly found that certain group (III/V) or (TI/VT) semi-conductors have excellent lattice match to graphene. Alternatively, a lattice matching base layer can be used to start the thin film growth process to therefore allow the formation of thin films on a graphitic substrate.

SUMMARY OF INVENTION

Thus, viewed from one aspect the invention provides a composition of matter comprising a film on a graphitic substrate, said film having been grown epitaxially on said substrate,
wherein said film comprises at least one group III-V compound or at least one group II-VI compound or a group IV compound, preferably at least one group III-V compound or at least one group II-VI compound.

Viewed from another aspect the invention provides a process for preparing a film grown epitaxially on a graphitic substrate comprising the steps of:

(I) providing group II-VI elements or group III-V elements or group IV elements or group IV elements to the surface of said graphitic substrate, preferably via a molecular beam; and (II) epitaxially growing a group III-V or group II-VI film on the surface of the graphitic substrate or a group IV compound.

Viewed from another aspect the invention provides a process for growing a film on a graphitic substrate comprising the steps of:

(I) providing a base layer film on said substrate, wherein said base layer film comprises an element or compound having a lattice mismatch of 2.5% or less, preferably 1% or less to that of graphene;

(II) contacting said base layer film with group II-VI elements or group III-V elements preferably via a molecular beam so as to grow a group III-V or group II-VI film.

Viewed from another aspect the invention provides a composition of matter comprising a film on a graphitic substrate wherein said composition comprises, in the following order,
(a) a graphitic substrate,
(b) a base layer film comprising an element or compound having a lattice mismatch of 2.5% or less, 1% or less to that of graphene; and
(c) a film comprising a group III-V compound or group II-VI compound or a group IV compound, preferably a group III-V compound or a group II-VI compound.

Viewed from another aspect the invention provides a composition of matter comprising a film on a graphitic substrate wherein said composition comprises, in the following order,
(a) a graphitic substrate,
(b) a base layer film comprising GaSb, InAs, AsSb, GaN, SbBi, AlAs, AlSb, CdSe or Sb, preferably GaSb, InAs, AsSb, GaN, SbBi or Sb; and
(c) a film comprising a group III-V compound or group II-VI compound or a group IV compound, preferably a group III-V compound or a group II-VI compound.

Optionally, the surface of the graphitic substrate can be chemically/physically modified to enhance the epitaxial growth of films.

Viewed from another aspect the invention provides a device, such as an electronic device, comprising a composition as hereinbefore defined, e.g. a solar cell.

Viewed from another aspect the invention provides the use of molecular beam epitaxy to grow at least one film as hereinbefore defined on a graphitic substrate.

Definitions

By a group III-V compound is meant one comprising at least one ion from group III and at least one ion from group V. Similarly, a group II-VI compound is one comprising at least one group II ion and at least one group VI ion. In this application the term group (II) covers both classic group (IIa) and (IIb) periods, i.e. the alkaline earth series and the Zn series of elements. There may be more than one ion present from each group, e.g. InGaAs (i.e. a ternary compound) and so on. Quaternary compounds may also be present and so on.

A group IV compound is one comprising two or more elements from group IV, preferably i.e. C, Si, or Ge, such as SiC. In all embodiments, the film is preferably one comprising a group III-V compound or group II-VI compound.

Graphitic substrates are substrates composed of single or multiple layers of graphene or its derivatives. The term graphene refers to a planar sheet of $sp^2$-bonded carbon atoms in a honeycomb crystal structure. Derivatives of graphene are those with surface modification. For example, hydrogenatoms can be attached to the graphene surface to form graphane. Another option is chlorographene. Graphene with oxygen atoms attached to the surface along with carbon and hydrogen atoms is called as graphene oxide. The surface modification can be also possible by chemical doping or oxygen/hydrogen plasma treatment.

The term epitaxy comes from the Greek roots epi, meaning "above", and taxis, meaning "in ordered manner". The atomic arrangement of the film is based on the crystallographic structure of the substrate. It is a term well used in this art. Epitaxially growth means herein the growth on the substrate of a film that mimics the orientation of the substrate.

Molecular beam epitaxy (MBE) is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure. An MBE process is described in detail below. Over time, the oncoming atoms form a film.

The film which forms on the substrate is preferably continuous. It cannot therefore be regarded as a series of discreet plaques rather the film forms over a portion of the substrate surface such as at least 50% of the substrate surface. However, as discussed further below, the film can also be deposited in the holes of a mask.

The amount of lattice mismatch is measured against any lattice constant of graphene with any lattice constant of the semi-conductor as explained below. If a semiconductor compound or element has a lattice constant that is within 1% of one of the lattice constants of graphene, then the semiconductor is suitable for use as a base layer herein and may also be deposited directly onto the graphitic substrate.

We regard a close lattice mismatch to be up to 1% mismatch, an almost perfect lattice match is up to 0.1% mismatch.

DETAILED DESCRIPTION OF INVENTION

This invention concerns the epitaxial growth of thin films on a graphitic substrate. The composition of the invention comprises both the substrate and the films grown thereon and optionally the carrier.

Having a film grown epitaxially provides homogeneity to the formed material which may enhance various end properties, e.g. mechanical, optical or electrical properties.

Epitaxial films may be grown from gaseous or liquid precursors. Because the substrate acts as a seed crystal, the deposited precursors can take on a lattice structure and orientation identical to those of the substrate. This is different from other thin-film deposition methods which deposit polycrystalline or amorphous films, even on single-crystal substrates.

In the present invention, the substrate is a graphitic substrate, more especially it is graphene. As used herein, the term graphene refers to a planar sheet of $sp^2$-bonded carbon atoms that are densely packed in a honeycomb (hexagonal) crystal lattice. This graphene substrate should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate is 20 nm in thickness or less. Graphene sheets stack to form graphite with an interplanar spacing of 0.335 nm. The substrate preferably comprises only a few such layers and may ideally be less than 10 nm in thickness. Even more preferably, it may be 5 nm or less in thickness. The area of the substrate is not limited. This might be as much as 0.5 mm$^2$ or more, e.g. up to 5 mm$^2$ or more such as up to 10 cm$^2$. The area of the substrate is thus only limited by practicalities.

It will be clear that the graphitic substrate may need to be supported in order to allow growth of the films thereon. The graphene sheet can be supported on any kind of materials including conventional semiconductor substrates, metals and transparent glasses. Thus glass or metal foil can be used. The use of silica is especially preferred or a compound of Si such as SiC. The use of SiC is a particularly preferred embodiment.

The support must be inert. It is also possible to grow the graphitic substrate directly on a metallic film deposited on an oxidized silicon wafer or directly on metal foils. Then the graphitic substrates can be detached from the metal by etching and easily transferred on to any materials.

In a highly preferred embodiment, the graphitic substrate is a laminated substrate exfoliated from a Kish graphite, or is a highly ordered pyrolytic graphite (HOPG). Alternatively, it could be a chemical vapour deposition (CVD)-grown graphene substrate on metallic films or foils made of e.g. Cu, Ni or Pt.

Whilst it is preferred if the graphitic substrate is used without modification, the surface of the graphitic substrate can be modified. For example, it can be treated with plasma of hydrogen, oxygen, NO$_2$ or their combinations. Treatment with nitrogen is also possible. Oxidation of the substrate might enhance film nucleation. It may also be preferable to pretreat the substrate, for example, to ensure purity before film growth. Treatment with a strong acid such as HF or BOE is an option. Substrates might be washed with isopropanol, acetone, or n-methyl-2-pyrrolidone to eliminate surface impurities.

The cleaned graphitic surface can be further modified by doping. A solution of FeCl$_3$, AuCl$_3$ or GaCl$_3$ could be used in a doping step. Ideally, the graphitic substrate used should be a good conductor. Any impurities in the substrate can be extracted into the forming semiconductor film and that might not be preferred. This process is avoided if the substrate is free of impurities.

As the present invention targets thin films, it will also be important that the graphitic substrate is smooth. It should be free of grain boundaries and preferably only one type of the possible A, B or C type stacked graphene layers at the surface will be present. If more than one of the A, B or C type stacked graphene layers is present at the surface, then different sections of the growing film may not be in registry and will thus cause defects in the forming film.

Highly smooth graphene support structures are taught in the literature, e.g. in Virojanadara, C.; Yakimova, R.; Zakharov, A. A.; Johansson, L. I., Large homogeneous mono-/bi-layer graphene on 6H—SiC(0001) and buffer layer elimination. J. Phys. D: Appl. Phys. 2010, 43, 374010. Carriers such as SiC and Si are preferred.

The use of graphitic substrates, ideally thin graphitic substrates, is highly advantageous in the present invention as these are thin but very strong, light and flexible, highly electrically conducting and thermally conducting. They are transparent at the low thicknesses preferably employed herein, they are impermeable and inert.

Semiconductor Films

In order to prepare thin films of commercial importance, it is essential that these grow epitaxially on the substrate. This is achieved herein by ensuring an excellent lattice match between the graphene substrate and the thin film, or optionally via a lattice match of a base layer film as described in detail below.

It is ideal if growth of the film occurs in the [111] (for cubic crystal structure) or [0001] (for hexagonal crystal structure) direction. As noted above, there is no guarantee that this is possible with a particular substrate where that substrate material is different from the film being grown. The present inventors have determined, however, that epitaxial growth on graphitic substrates is possible by determining a possible lattice match between the atoms in the semiconductor film and the carbon atoms in the graphene sheet.

The carbon-carbon bond length in graphene layers is about 0.142 nm. Graphene has hexagonal crystal geometry. The present inventors have surprisingly realised that graphitic substrates can provide a substrate on which semiconductor films can be grown as the lattice mismatch between the growing film material and the graphitic substrate can be very low.

The inventors have realised that due to the hexagonal symmetry of the graphitic substrate and the hexagonal symmetry of the semiconductor atoms in the (111) planes of a film growing in the [111] direction with a cubic crystal structure (or in the (0001) planes of a film growing in the [0001] direction with a hexagonal crystal structure), a lattice match can be achieved between the growing films and the substrate.

FIGS. 1a-1d show four different hexagonal structural configurations of the semiconductor atoms in the (111) (or (0001)) planes of a semiconductor film on top of the hexagonal lattice of carbon atoms in the graphene layer, placed in such a way that no lattice mismatch will occur. As possible semiconductor adsorption sites on top of graphene, we consider 1) above the center of the hexagonal carbon rings of graphene (H-site) and 2) above the bridge between carbon atoms (B-site), as indicated by arrows in FIG. 1a.

The figures show an idealised lattice-matched arrangement of the semiconductor atoms in the (111) planes of a cubic crystal ((0001) planes for hexagonal crystal) when the atoms are placed on 1) H- and B-sites (FIGS. 1a, 1b and 1d), and 2) H- or B-sites (FIG. 1c). Dashed lines emphasize the hexagonal symmetry of the lattice of semiconductor atoms in the (111) plane. The relative rotations of these hexagons for each atomic arrangement are written on the top of each figure. For (FIG. 1a) and (FIG. 1d), two relative orientations are possible, ±10.9° and ±16.1°, respectively (only the + rotations are shown in the images).

FIG. 1e shows artificial lattice-matched lattice constants for the atomic arrangements in (a), (b), (c) and (d). Dashed and solid lines correspond to the hexagonal ($a_1$) and cubic ($a=a_1\times\sqrt{2}$) crystal phases of these lattices, respectively. The square (■) and the hexagon represent the cubic and the hexagonal phases, respectively, for Si, ZnO, and binary III-V semiconductors.

If the semiconductor atoms are placed above alternating H- and B-sites as in FIG. 1a, an exact lattice match can be achieved if the lattice constant, a, of a cubic semiconductor crystal (the lattice constant, a, is defined as the side length of the cubic unit cell) is equal to: 4.607 Å. A few binary cubic semiconductors exist with lattice constants close to this value, with the closest being AlN (a=4.40 Å) and GaN (a=4.51 Å). For hexagonal semiconductor crystals, exact lattice matches will be achieved if the lattice constant, $a_1$, is equal to: 3.258 Å. A few binary hexagonal semiconductors exist with lattice constants close to this value, with the closest being SiC ($a_1$=3.07 Å), AlN ($a_1$=3.11 Å), GaN ($a_1$=3.19 Å) and ZnO ($a_1$=3.25 Å) crystals.

If the semiconductor atoms are placed above alternating H- and B-sites as in FIG. 1b, an exact lattice match can be achieved if the lattice constant, a, of a cubic semiconductor crystal is equal to: 1.422 Å×3/2×sqr(6)=5.225 Å. This is close to the lattice constant of GaP (a=5.45 Å), AlP (a=5.45 Å), InN (a=4.98 Å) and ZnS (a=5.42 Å). For hexagonal semiconductor crystals exact lattice matches will be achieved if the lattice constant, $a_1$, is equal to: 1.422 Å×3/2×sqr(3)=3.694 Å. This is close to the $a_1$ lattice constants of the hexagonal forms of InN ($a_1$=3.54 Å) and ZnS ($a_1$=3.82 Å) crystals.

For the atomic configuration as in FIG. 1c, an exact lattice match can be achieved if the lattice constant, a, of a cubic semiconductor crystal is equal to: 1.422 Å (carbon atom distance)×3×sqr(2)=6.033 Å. This is close to the lattice constant of group III-V compounds such as InAs, GaAs, InP, GaSb, AlSb and AlAs, and II-VI compounds such as MgSe, ZnTe, CdSe, and ZnSe semiconductor crystals. In particular, this is close to the lattice constant of group III-V compounds such as InAs (a=6.058 Å), GaSb (a=6.096 Å) and AlSb (a=6.136 Å), and II-VI compounds such as ZnTe (a=6.103 Å) and CdSe (a=6.052 Å) semiconductor crystals.

For hexagonal semiconductor crystals, exact lattice matches will be achieved if the lattice constant, $a_1$, is equal to: 1.422 Å (carbon atom distance)×3=4.266 Å. This is close to the $a_1$ lattice constants of the hexagonal forms of the II-VI materials CdS ($a_1$=4.160 Å) and CdSe ($a_1$=4.30 Å) crystals which means that the ternary semiconductor CdSSe can provide a perfect lattice match for a certain molar fraction of S.

If the semiconductor atoms are placed above alternating H- and B-sites as in FIG. 1d, an exact lattice match can be achieved if the lattice constant, a, of a cubic semiconductor crystal is equal to: 6.28 Å. This is close to the lattice constant of InSb (a=6.479 Å), MgTe (a=6.42 Å) and CdTe (a=6.48 Å).

Certain ternary compounds like e.g. InGaSb, InAsSb and AlInSb can provide a perfect lattice match, as can some quaternary compounds like InGaAsSb and AlInAsSb. For hexagonal semiconductor crystals, exact lattice matches will be achieved if the lattice constant, $a_1$, is equal to: 4.44 Å. This is close to the $a_1$ lattice constants of the hexagonal forms of InSb ($a_1$=4.58 Å), MgTe ($a_1$=4.54 Å) and CdTe ($a_1$=4.58 Å) crystals.

Without wishing to be limited by theory, due to the hexagonal symmetry of the carbon atoms in graphitic layers, and the hexagonal symmetry of the atoms of cubic or hexagonal semiconductors in the [111] and [0001] crystal direction, respectively, a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of films on graphitic substrates.

The four different hexagonal arrangements of the semiconductor atoms as described above, can enable semiconductor films of such materials to be grown.

Whilst it is ideal that there is no lattice mismatch between a growing film and the substrate, small lattice mismatches are possible. The films of the invention ideally have a lattice mismatch of up to about 1% with the substrate. More preferably, lattice mismatches should be 0.5% or less, e.g. 0.25% or less. These values apply to any film thickness. Lattice match values can be calculated based on a knowledge of the crystal structure of the semiconductor in question and the information provided above. If a semiconductor can grow in a form with a lattice constant that matches any of the atomic arrangements depicted in FIG. 1a-1d for its (111) plane in case of cubic crystal or for its (0001) plane in case of hexagonal crystal, then an appropriate lattice match is present. For the avoidance of doubt, the lattice match should be calculated for the whole of the film present on the substrate. Note however, that the success of the process of the invention depends, to an extent, on the thickness of the film. Thus, average strain for a total film thickness of 100 nm should typically be less than 0.5%. Average strain for a total film thickness of 0.5 μm should typically be less than 0.2%. Average strain for a total thickness of 1 μM should typically be less than 0.15%. Average strain for a total thickness of 5 μm should typically be less than 0.1%. In order to avoid defects in thicker films therefore, it is preferred if the lattice mismatch is as small as possible.

For some binary semiconductors like cubic InAs (a=6.058 Å), cubic GaSb (a=6.093 Å), cubic CdSe (a=6.052 Å), and hexagonal CdSe ($a_1$=4.30 Å), the lattice mismatch is so small (<~1%) that excellent growth of these binary semiconductors can be expected for film thicknesses up to several tens of nm. However, as the film grows thicker strain compensating growth techniques may need to be employed in order to reduce the strain energy and avoid crystal defects like dislocations. In essence therefore, film thickness up to the critical thickness can be achieved without defect risk. This will be of order 30 nm for 1.0% lattice mismatch and of order 100 nm for 0.5% misfit. Thus, beyond the critical thickness superlattice techniques may be needed or different semiconductor materials such as ternary or quaternary semiconductors.

Of course, due to their nature, the lattice constants of ternary, quaternary etc compounds can be manipulated by changing the relative amount of each element present. The lattice constants of these compounds can be tuned to a certain value by tuning the composition of these compounds. The use therefore, of ternary and quaternary semiconductor compounds is preferred when thicker films, such as more than 100 nm, are desired. Devices may require a total film thickness of the order of typically from 1 to 10 μm.

It is within the scope of the invention for the film being grown on the substrate to comprise multiple layers of different group (III)(V) or (II)(VI) compounds. Thus, a ternary or quaternary semiconductor might be grown on a binary semiconductor.

Other multiple layer films might result from the use of compensating growth techniques such as strained superlattices. If the film contains superlattices, each layer of the superlattice could have more than 1% strain if strain compensation is used such that the average lattice constant of the superlattice as a whole is lattice-matched to the graphitic substrate.

Such compensating growth techniques would be known to the skilled man.

It will be appreciated, however, that for certain semiconductor combinations there might be too large mismatch between the lattice constant of the semiconductor and the lattice constant of graphene for successful film growth. In such circumstances, it may not be possible to grow such a semiconductor directly onto the graphitic substrate.

Base Layer

In order to allow other semiconductor films to be present and maximise the possibilities here, the inventors propose the use of an intermediate layer or base layer between a semiconductor thin film and the substrate. This method is preferably used where the semiconductor cannot be lattice matched with the graphitic substrate or that the particular semiconductor for some reason does not form a thin film directly on the graphitic surface, e.g. because none of its constituents have enough surfactant behaviour to cover the graphitic surface.

This intermediate layer is one which is lattice-matched and therefore forms a kind of surfactant between a thin film semiconductor layer and the graphitic substrate. The base layer material, which can be an element or compound has a lattice mismatch of 2.5% or less, preferably 1% or less with graphene. For example, the lattice mismatch between (111) oriented Sb (rhombohedral A7) and graphene is 1.0% when Sb atoms are positioned above H sites only, B sites only or T sites only. GaSb also has 1.0% lattice mismatch with graphene. InAs has 0.43% lattice mismatch with graphene. This base layer need only be a few atomic layers thick.

By using a base layer that itself is "3-dimensional", this layer provides lone pairs through which a semiconductor layer can start to grow. The adhesion to the "2-dimensional" substrate is achieved via the use of the base layer.

The base layer is preferably a group V element or alloy of a group III-V compound such as GaSb, InAs, AsSb, SbBi or Sb. AlSb might also be used. The alloy As(0.077)-Sb(0.923) should be perfectly lattice-matched to graphene, in the configuration of FIG. 1(c). (Where 0.077 is the As molar fraction in the alloy.) Likewise an Sb—Bi alloy can be lattice-matched to the configuration in FIG. 1 (d).

Another option is a ternary lattice-matched base layer, such as those based on AlAsSb, AlInSb, In GaSb or AlInAs A further option is a combination of base layers, such as an elemental layer of Sb followed by a ternary layer as described above. The Sb layer could be as little as one atom thick although more likely the layer might be a two or three atoms thick.

A further option for the base layer might be CdSe or CdSSe. In one embodiment CdSSe might be grown on a layer of CdSe to form the base layer.

The use of Sb is most preferred as the base layer. The (111)-oriented bilayers of rhombohedral, A7, Sb has a close lattice match to graphene (1.0% mismatch). The base layer can be deposited on the substrate using the techniques discussed in detail below in connection with the deposition of the semiconductor.

However, when the base layer is Sb, it is preferred if this is deposited under mild conditions, such as less than 200° C., preferably 100 to 135° C., or such as less than 325° C., preferably 200 to 300° C., dependent on the flux intensity of $Sb_4$ or $Sb_2$ that is used during deposition, the latter conditions being ideal for $Sb_2$.

As noted above, only a few atomic layers (perhaps only one atomic layer or two atomic layers) of the base layer is required. In case of Sb, the minimum would be a (111)-oriented Sb bilayer. It should be considered that laying down one Sb atomic layer with the next layer being Ga is the same as a GaSb base layer and hence the same as growing the GaSb directly on graphene. Once the base layer is present, the semiconductor film can be deposited. Where a base layer is used, it may be that the initial growth of semiconductor film takes place at a lower temperature similar as was used for the deposition of group V element (or group V alloy etc). A third step can then involve the deposition of III-V film(s) at higher temperature typical for normal epitaxial growth of the III-V compound in question. The second step above is preferred to avoid desorption of group V element (or group V alloy) during the third step.

It may be that to grow a superlattice on a graphitic substrate where each layer of the superlattice has too much strain for it to be possibly grown directly on graphene that a base layer is required, e.g. of Sb, GaSb or InAs. It may also be possible to use AlSb (lattice mismatch 1.7%).

The base layer may also be a "superlattice" with alternating atomic layers [(111)-planes] of Sb and Bi. This superlattice would make a close lattice match to the "d" in FIG. 1(c) and thus provide a substrate with a lattice constant where there are no binary substrates available today.

Semiconductors

The semiconductor films of the invention are formed from at least one III-V compound or at least one II-VI compound or a group IV compound such as SiC.

Group II elements are Be, Mg, Ca, Zn, Cd, and Hg. Preferred options here are Zn and Cd.

Group III options are B, Al, Ga, In, and Tl. Preferred options here are Ga, Al and In.

Group V options are N, P, As, Sb. All are preferred.

Group VI options include 0, S, Sc and Tc. The use of O, Sc and Tc is preferred.

The manufacture of a group III-V film is preferred. It will be appreciated that any compound which forms during film growth need not be completely stoichiometric as the possibility of doping exists, as discussed below.

Preferred binary compounds for film manufacture include InAs, GaAs, AlAs, InP, GaP, AlP, InSb, GaSb, AlSb, ZnTe, CdSe and ZnSe. It is within the scope of the invention to grow alternating thin layers (of order 1 nm or a few nm thick) of binary semiconductors such that the electronic properties and average lattice constant of the thin film as a whole is matched with the substrate. The use of GaSb or InAs is highly preferred. Other options include ZnO and AlSb It is preferred in the film is not AlN.

Whilst the use of binary materials is possible, the growth of ternary or quaternary films or even quintinary films is preferred. Especially preferred options are InGaAs, InAlAs, InAsP, InPSb, InAsN, InPN, InSbN, GaInSb, GaAsN, GaInN, GaPN, GaSbN, AlInSb, AlAsSb, AlSbP, AlInN, AlPN, AlAsN, AlSbN, InGaAsSb, AlGaAsSb, and InGaAsN as these can be grown perfectly lattice-matched to graphene, and are suitable for a number of devices. It will be appreciated that in ternary, quaternary etc materials the relative amounts of each ion can vary.

The ternary compounds may therefore be of formula XYZ wherein X is a group III element, Y is a group III or V element different from X and Z and Z is a group V element. The X to Y or Y to Z molar ratio in XYZ is preferably 0.2 to 0.8, i.e. the formula is preferably $X_xY_{1-x}Z$ (or $XY_{1-x}Z_x$) where subscript x is 0.2 to 0.8. Quaternary systems may be represented by the formula $A_xB_{1-x}C_yD_{1-y}$ where A and B are group III elements and C and D are group V elements. Again subscripts x and y are typically 0.2 to 0.8. Other options will be clear to the skilled man.

It is within the scope of the invention for the films to be doped. Doping typically involves the introduction of impurity ions into the film. These can be introduced at a level of up to $10^{19}$/cm$^3$, preferably up to $10^{18}$/cm$^3$. The films can be undoped, p-doped or n-doped as desired. Doped semiconductors are extrinsic conductors whereas undoped ones are intrinsic.

Extrinsic semiconductors with a larger electron concentration than hole concentration are known as n-type semiconductors. In n-type semiconductors, electrons are the majority carriers and holes are the minority carriers. N-type semiconductors are created by doping an intrinsic semiconductor with donor impurities. Suitable donors for III-V compounds can be e.g. Si and Te. Suitable donors for group IV semiconductors can be e.g. P and As.

The p-type semiconductors have a larger hole concentration than electron concentration. The phrase 'p-type' refers to the positive charge of the hole. In p-type semiconductors, holes are the majority carriers and electrons are the minority carriers. P-type semiconductors are created by doping an intrinsic semiconductor with acceptor impurities. Suitable acceptors for III-V compounds can be e.g. Be and Zn. Suitable acceptors for group IV semiconductors can be e.g. B. It will be appreciated that whether an impurity will act as a donor or acceptor in a III-V compound will in some cases depend on the orientation of the growing surface and the growth conditions. Dopants can be introduced during the growth process or by ion implantation of the films after their formation. Doping may also be effected by allowing impurities from the substrate to enter the semi-conductor film.

Preferred films of the invention will contain dopants.

Once the film growth has been established on the graphene substrate, there is no real limit to the manipulations that can be carried out. Different film layers can be added simply by changing the nature of the atoms present. For example, a film is established, it would also be possible to grow a top film layer in which there was a "p-i-n" or "n-i-p" structure by use of appropriate doping techniques. Thus, initially the film might be p-doped before an undoped intrinsic layer is applied and an n-doped layer is introduced (or vice versa).

It will be appreciated that doping only part/parts of the film is possible, e.g. using ion implantation for specific components. Doping may therefore occur processing after growth.

Films

The films grown in the present invention may be from 250 nm to several microns in thickness, e.g. 0.5 to 10 microns, more preferably 1 to 5 microns. The surface area of the films is limited only by the apparatus used to deposit the films and the size of the substrate. The surface area may also be dictated by the size of the holes in which the film is grown, as described further below.

The thickness of the films is often controlled by the length of time for which the growing process runs. A longer process typically leads to a thicker film.

The base layer when present may be one or two atomic thicknesses, e.g. 2 Å or more up to 10's of nanometres depending on the nature of the base layer and the nature of the thin film grown upon that base layer.

Film/Base Layer Deposition/Growth

We deal firstly with the direct deposition of films of the invention on a graphitic substrate. The films of the invention grow epitaxially on the substrate or base layer. They attach to the underlying graphitic substrate through covalent, ionic or quasi van der Waals binding. Accordingly, at the junction of the substrate and the film, crystal planes are formed epitaxially. These build up, one upon another, in the same crystallographic direction thus allowing the epitaxial growth of the film.

The films of the invention should preferably grow in the [111] direction for films with cubic crystal structure and [0001] direction for films with hexagonal crystal structure. Planes (111) and (0001) both represent the same (hexagonal) plane of the film, it is just that the nomenclature of the plane varies depending on the crystal structure of the growing film.

The films are preferably grown by molecular beam epitaxy (MBE). Whilst it is within the scope of the invention for vapour deposition to be used, e.g. a CVD especially a metal organic CVD (MOCVD) or metal organic vapour phase epitaxy (MOVPE) method, the use of MBE is highly preferred.

In this method, the substrate is provided with a molecular beam of each reactant, e.g. a group III element and a group V element preferably supplied simultaneously. It may, however, be advantageous to begin the deposition process using one reactant at a time. Thus a first layer might involve deposition of Sb followed by the application of Ga. A first layer might involve deposition of In followed by As or vice versa. The deposition might involve growth of AlSb, preferably Sb then Al. Once both reactants are present and each has formed an atomic layer, a compound of these two will form. This alternating deposition may or may not be repeated one or more times. Thereafter, both ions can be supplied simultaneously and a film will continue to grow. The substrate temperature may need to be raised before growing in conventional MBE mode with group III-V elements.

A higher degree of control of the nucleation and growth of the films on the graphitic substrate might be achieved with the MBE technique by using migration-enhanced epitaxy (MEE) where group (III) (V) elements are supplied alternately with no time in between or atomic-layer MBE (ALMBE) where e.g. the group III and V elements can be supplied alternately with a delay in between.

A preferred technique is solid-source MBE, in which very pure elements such as gallium and antimony are heated in separate effusion cells, until they begin to slowly evaporate (e.g. gallium) or sublimate (e.g. antimony). The gaseous elements then condense on the substrate, where they may react with each other. In the example of gallium and antimony, single-crystal gallium antimonide is formed. The use of the term "beam" implies that evaporated atoms (e.g. gallium) or molecules (e.g. Sb$_4$ or Sb$_2$) do not interact with each other or vacuum chamber gases until they reach the substrate.

Doping ions can also be introduced easily using MBE. FIG. 2 is a possible set up of an MBE process.

Molecular beam epitaxy (MBE) takes place in ultra high vacuum, with a background pressure of typically around $10^{-10}$ to $10^{-9}$ Torr. Films are typically grown slowly, such as at a speed of up to a few, such as about 2, μm per hour. This allows films to grow epitaxially and maximises structural performance.

The growth temperature may be in the range 300 to 700° C. for a conventional II-VI or III-V semiconductor film. Much lower temperatures are needed for base layer growth which is typically around 130° C. The temperature employed is, however, specific to the nature of the material in the film, the surface orientation, and fluxes of III and V elements used. For GaAs growth on GaAs(001) surface, a preferred temperature is 580 to 630° C., e.g. 590° C. For GaAs growth on GaAs(111) surface, such as the GaAs (111)B surface a higher temperature is preferred, e.g. 530° C. or higher such as 610° C. or higher. For InAs and GaSb the range is lower, for example 430 to 540° C., such as 450° C. for InAs growth on InAs (001) surface and 465° C. for GaSb growth on GaSb(111) surface. GaSb growth on GaSb (001) surface may occur at 490° C. Appropriate temperatures will be found by the skilled person.

Film growth can be initiated by opening the shutter of the Ga/In effusion cell and the shutter and/or valve of counter ion effusion cell (e.g. arsenic or antimony), simultaneously (continuous (analog or digital) MBE growth) or alternating (MEE, ALMBE).

The temperature of the effusion cells can be used to control growth rate. Convenient growth rates are 0.05 to 2 μm per hour, e.g. 1 μm per hour.

The beam equivalent pressure (flux) of the molecular beams can also be adjusted depending on the nature of the film being grown. Suitable levels for beam equivalent pressures are between $1 \times 10^{-8}$ and $1 \times 10^{-5}$ Torr.

The beam flux ratio between reactants (e.g. group III atoms and group V molecules) can be varied, the preferred flux ratio being dependent on other growth parameters and on the nature of the film being grown.

A significant benefit of MBE is that the growing film can be analysed in situ, for instance by using reflection high-energy electron diffraction (RHEED). RHEED is a technique typically used to characterize the surface of crystalline materials. This technology cannot be applied so readily where films are formed by other techniques such as MOVPE.

As noted above, the films of the invention preferably grow as cubic (zinc blende) or hexagonal (wurtzite) structures. It is also within the scope of the invention for the nature of the material forming the film to be changed during the growing process. Thus, by changing the nature of the molecular beams, a portion of different structure would be introduced into a film. An initial GaAs film could be extended with an InAs film section for example by changing from a Ga feed to an In feed. The GaAs/InAs film could then be extended with a GaAs film section by changing back to a Ga feed and so on. It is also within the scope of the invention to include nanostructures in the film during the growing process, e.g. InAs or GaSb quantum dots in GaAs matrix. The growth of such nanostructures will be known to the skilled man. Again, by developing different structures with differing electrical properties, the inventors offer films with interesting and manipulable electronic properties which can be tailored by the manufacturer towards all manner of end applications.

Where a base layer is present, the base layer is preferably deposited using one of the techniques described above, e.g. ALMBE. Thereafter, semi-conductor formation follows the instructions above.

In one embodiment, after an initial elemental base layer film is deposited, often an Sb layer, a second elemental layer, typically of a different material can be deposited such as a Ga layer. It may be worthwhile to lay down alternate atomic layers such as of Sb and Ga before starting to grow a desired semiconductor but preferably only one atomic layer of Ga is laid down and this marks the start of the GaSb layer, on top of which e.g. InAs or a ternary or a quaternary compounds could be grown.

It may also be useful, initially to apply a flux of the components of the semi-conductor separately. Thus a flux of element (III) is applied and then element (V), or alternatively in the reverse order, before a joint simultaneous flux can be used to grow the film.

If a base layer is used which is heat sensitive, such as an Sb base layer, once III-V film growth is established, temperature can be increased to conventional epitaxial deposit temperatures. The semiconductor film grown need not be the same as the base layer or contain the element(s) of the base layer.

The base layer or main film can be doped. Once semi-conductor film growth has started doping can be initiated. If present, doping should be begun a few atomic layers into film formation. This will ideally introduce an ohmic contact into the film. A preferred dopant is Si or Te. Alternatively, the dopant can be Be, or Mg. Mg is used as a preferred dopant for p-type nitrides. Be is used as preferred dopant for p-type arsenides and antimonides. Si is used as preferred dopant for n-type arsenides and nitrides, whereas Te is used as preferred dopant for n-type antimonides.

It will be appreciated that doping only part/parts of the film is possible, e.g. using ion implantation for specific components. Doping may therefore occur processing after growth.

In one embodiment, the film can be grown on a substrate provided with a mask. The mask protects the substrate but defines a pattern of holes in which film growth is intended. For example, a silicon dioxide or alumina mask can be applied on a graphitic substrate with a pattern of holes in the mask through which film growth occurs. Once film deposition has taken place, the mask can be left in place, partially removed or completely removed, e.g. by etching, to leave a series of thin films on the substrate corresponding to the position of the holes in the mask.

Applications

The films of the invention have wide ranging utility. They are semi-conductors so can be expected to offer applications in any field where semiconductor technology is useful. They are primarily of use in electronics and optoelectronic applications, e.g. in solar cells, photodetectors, light-emitting diodes (LEDs), waveguides and lasers.

An ideal device for their deployment might be a thin film solar cell. Such solar cell has the potential to be efficient, cheap and lightweight at the same time.

This is a rapidly developing field and further applications on these valuable materials will be found in the next years.

The invention will now be further discussed in relation to the following non limiting examples and figures.

BRIEF DESCRIPTION OF THE FIGURES

FIG. 1e shows artificial lattice-matched lattice constants for the atomic arrangements in (a), (b), (c) and (d). Dashed and solid lines correspond to the hexagonal ($a_1$) and cubic ($a = a_1 \times \sqrt{2}$) crystal phases of these lattices, respectively. The square (■) and the hexagon represent the cubic and the hexagonal phases, respectively, for Si, ZnO, and binary III-V semiconductors.

FIG. 5 shows that for SbGp13, triangle-like shaped GaSb platelets confirm the epitaxial relation with graphite substrate.

EXPERIMENTAL PROCEDURE

Figure 1A:
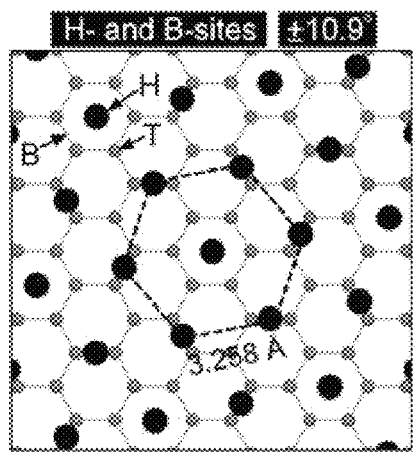
FIG. 1a-d shows the atomic arrangements when semiconductor atoms are placed above 1) H- and B-sites (FIGS. 1a, b, and d), and 2) H- or B-sites (FIG. 1c) on graphene.
Figure 1B:
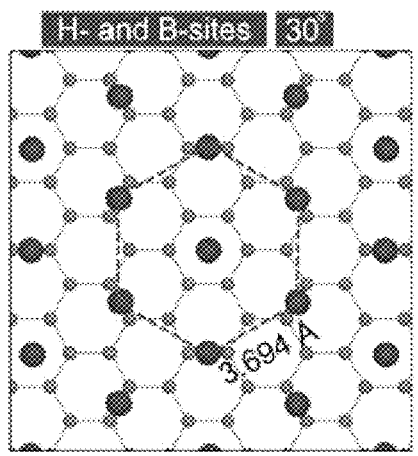
Figure 1C:
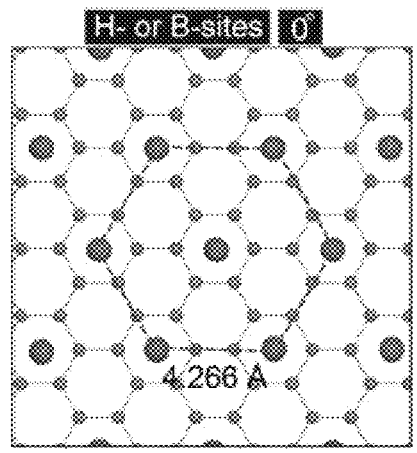
Figure 1D:
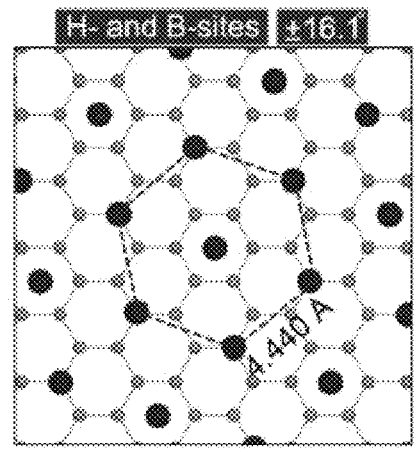
Figure 1E:
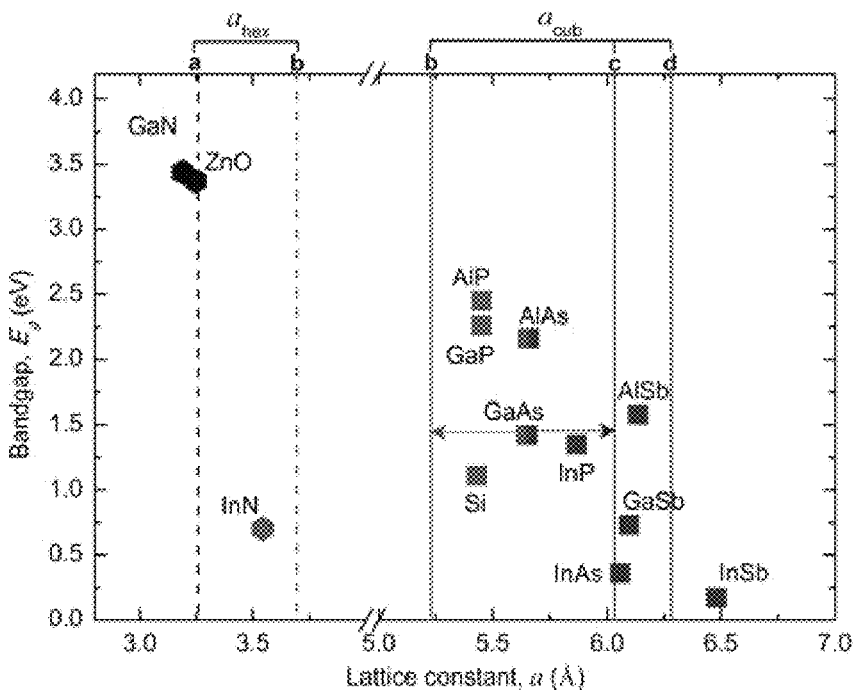
In FIG. 1e the bandgap energies of the III-V semiconductors (as well as Si and ZnO) are plotted against their lattice constants. Vertical solid (dashed) coloured lines depict the lattice constant of an ideal crystal that would give perfect lattice match with graphene for a cubic (hexagonal) crystal with the four different atomic arrangements (FIG. 1a-d) with respect to graphene. In the case of some binary semiconductors, the lattice mismatch with graphene is very small (e.g. InAs, GaSb, and ZnO) for one suggested atomic configuration. For other binary semiconductors like GaAs, the lattice mismatch is quite large and in-between two different atomic configurations (as in FIG. 1b or FIG. 1c). It can be realized from the figure that many ternary, quaternary and quintinary semiconductors can be perfectly lattice-matched to graphene.
Figure 2:
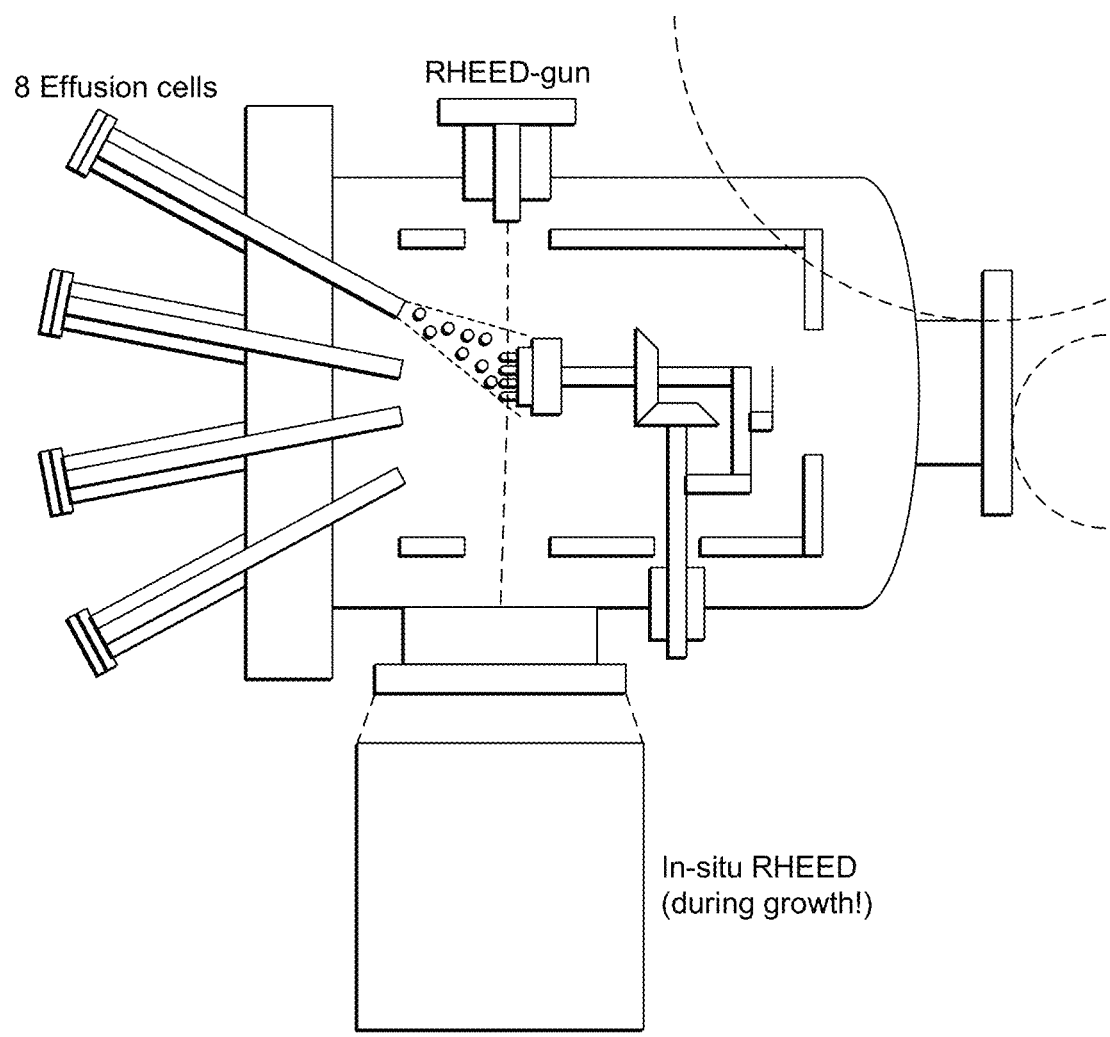
FIG. 2 shows an MBE experimental set up.
Figure 3:
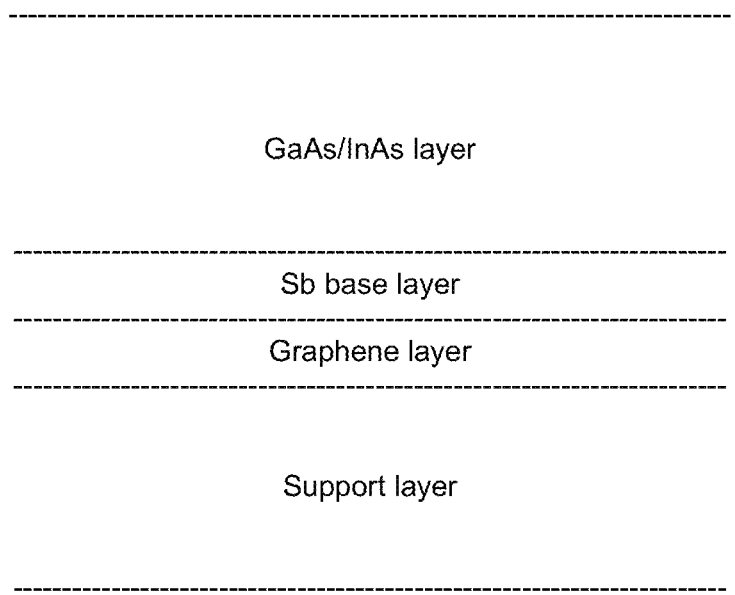
FIG. 3 is a theoretical side view of a support, graphene layer, base layer and top semiconductive layer.

Thin film is grown in a Varian Gen II Modular molecular beam epitaxy (MBE) system equipped with a regular Al filament cell, a Ga dual filament cell, an In SUMO dual filament cell, an As valved cracker cell, and an Sb valved cracker cell allowing to fix the proportion of dimers and tetramers. In the present study, the major species of arsenic are $As_2$, and antimony are $Sb_2$.

Growth of thin film is performed either on a Kish graphite flake or on a graphene film (1 to 7 monolayers thick, preferably only one monolayer thick) grown either by a chemical vapor deposition (CVD) technique directly on a metal film such as Cu, Ni, and Pt, or grown on SiC substrates by using a high-temperature sublimation technique. The graphene film samples are purchased from external suppliers. The CVD graphene films are purchased from "Graphene Supermarket", USA.

The CVD graphene film samples are cleaned by isopropanol followed by a blow dry with nitrogen, and then indium-bonded to a silicon wafer. The graphene/SiC substrates are blow dried with nitrogen, and then indium-bonded to a silicon wafer.

The samples are then loaded into the MBE system for the thin film growth. The samples are annealed at a substrate temperature of 550° C. (or higher) for a duration of 10 minutes to get rid of any oxide residues on the substrate. The deposition of III-V film is typically done by a three-step (if a base layer is used) or a two-step growth method. In case a base layer is used, the first step involves the deposition of a group V element (or of an alloy of group V elements) on the graphitic layers at lower substrate temperatures as described below. The second step involves the growth of III-V film at a lower substrate temperature similar as was used for the deposition of group V element (or group V alloy). The third step involves the deposition of III-V film(s) at higher temperature typical for normal epitaxial growth of the III-V compound in question. The second step above is preferred to avoid desorption of group V element (or group V alloy) during the third step.

Example 1

After annealing the graphene substrate at 550° C., the substrate temperature is then decreased to typically between 200° C. and 300° C. for Sb deposition. Sb flux is first supplied to the surface during a time interval typically in the range 5 s to 1 minute, dependent on Sb flux and substrate temperature. A few nm, preferably less than a few tens of nm, of Sb are then grown, preferably by MEE or ALMBE. Then, the substrate temperature is increased to a temperature suitable for GaSb thin film growth: i.e. around 450° C. The temperature of the Ga effusion cell is preset to yield a nominal planar growth rate of 0.3 μm per hour. The $Sb_2$ flux is set to $1 \times 10^{-6}$ Torr to grow the GaSb thin film at this temperature. The GaSb thin film is doped to a level appropriate for which device structure will be grown on top of this thin film template structure.

Example 2

After annealing the graphene substrate at 550° C., the substrate temperature is decreased to between 15° C. and 80° C. for As deposition, the temperature being dependent on which deposition rate is wanted. As flux is first supplied to the surface during a time interval typically in the range 5 s to 1 minute. A few nm, preferably less than a few tens of nm, InAs are then grown, preferably by MEE or ALMBE. Then, the substrate temperature is increased to a temperature suitable for InAs thin film growth: i.e. around 450° C. The temperature of the In effusion cell is preset to yield a nominal planar growth rate of up to 0.7 μm per hour. The $As_2$ flux is set to $6 \times 10^{-6}$ Torr to form the InAs thin film at this temperature. The InAs thin film is doped to a level appropriate for which device structure will be grown on top of this thin film template structure.

The substrates prepared in examples 1 and 2 hereby called as III-V/GP thin film substrate can be used as a template for the fabrication of various optoelectronic or electronic devices, and solar cells.

In Examples 3-4 below, we describe the deposition of 1) p-i-n doped homojunction GaSb thin film on III-V/GP thin film substrate, and 2) p-n doped heterostructure GaSb/InGaAsSb thin film on III-V/GP thin film substrate. These thin film structures are intended to use for applications such as light emitting diodes and photo detectors.

Example 3 p-i-n doped homojunction GaSb thin film is further grown on III-V/GP thin film substrate of example 1 to use it as a photodetector. The thickness of each of the p-doped, n-doped, and intrinsic III-V epilayer is typically kept between 0.5 and 3 μm. For p-type doping, Be is used. Te is used as an n-dopant. The Be cell temperature is set to 990° C. which gives a nominal p-type doping concentration of $3 \times 10^{18}$ $cm^{-3}$. The Te cell temperature is set to 440° C. which gives a nominal n-type doping concentration of $1 \times 10^{18}$ $cm^{-3}$. The deposition temperature for all the layers is set to 450° C. The temperature of the Ga effusion cell is preset to yield a nominal planar growth rate of 0.7 μm per hour, and the $Sb_2$ flux is set to $1 \times 10^{-6}$ Torr to grow the GaSb thin film.

Example 4 p-type_GaSb/intrinsic_GaInAsSb/n-type_GaSb thin film is further grown on III-V/GP thin film substrate. The composition of the intrinsic GaInAsSb is tailored such that it is lattice-matched to GaSb. The thickness of each these three epilayers is typically kept between 0.5 and 3 μm. For p-type doping, Be is used. Te is used as an n-dopant for the GaInAsSb epilayer. The Be cell temperature is set to 990° C. which gives a nominal p-type doping concentration of $3 \times 10^{18}$ $cm^{-3}$. The Te cell temperature is set to 440° C. which gives a nominal n-type doping concentration of $1 \times 10^{18}$ $cm^{-3}$.

Example 5 n-type GaSb/n+GaInAsSb/p-GaInAsSb/p+GaInAsSb thin film is further grown on III-V/GP thin film substrate to use it as a photodetector. The composition of the GaInAsSb is tailored such that it is lattice-matched to GaSb. The thickness of each of these epilayers is typically kept between 0.5 and 3 μm. For p-type doping, Be is used. Te is used as an n-dopant for the GaInAsSb epilayer. The Be cell temperature is set to 990° C. which gives a nominal p+ type doping concentration of $1\times10^{18}$ cm$^{-3}$, and the Be cell temperature is set to 940° C. which gives a nominal p-type doping concentration of $9\times10^{16}$ cm$^{-3}$ The Te cell temperature is set to 440° C. which gives a nominal n-type doping concentration of $1\times10^{18}$ cm$^{-3}$.

Example 6

Figure 4:
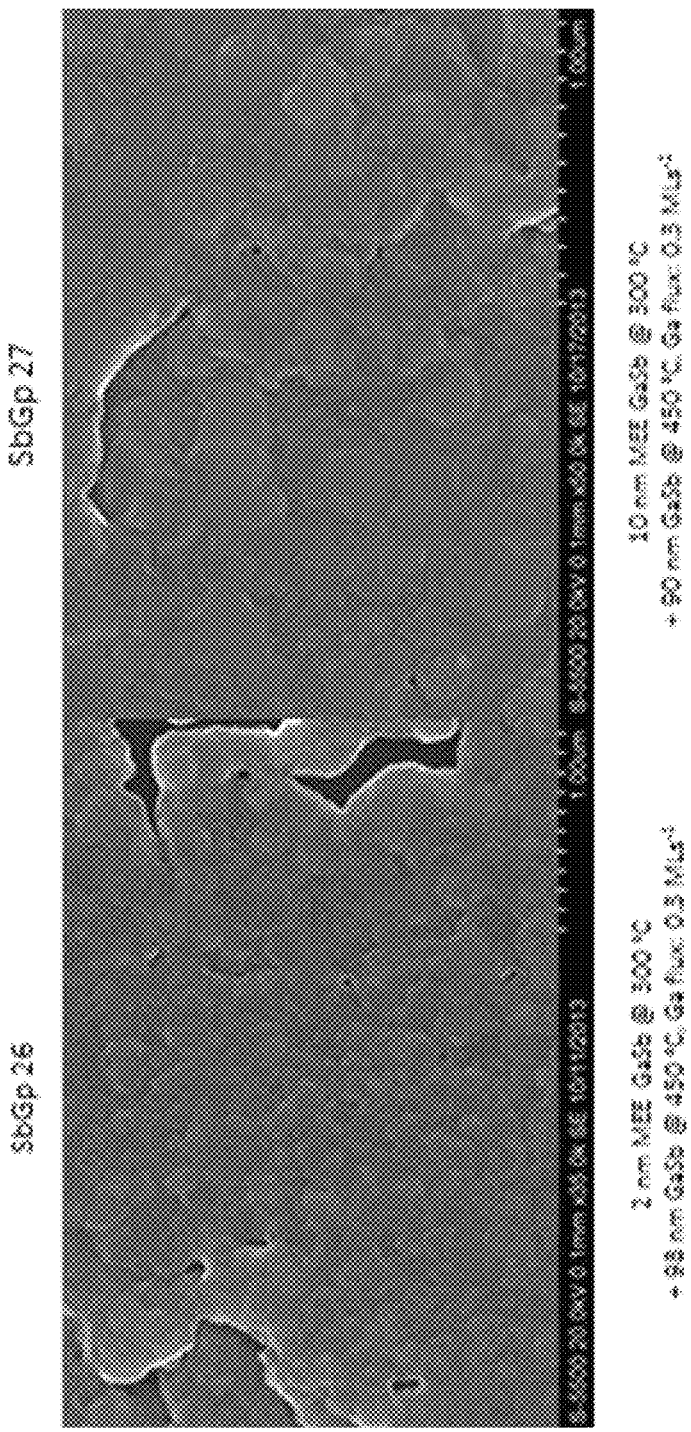
FIG. 4 shows a thin film of GaSb grown directly on a Kish graphite surface.

A series of thin films were grown directly on a Kish graphite. The conditions of growth are summarised in table 1. After annealing the sample at 550° C., the substrate temperature is reduced to the temperature shown in column 2 which the thin film is grown. The SEM images in FIG. 4 show that we have grown GaSb crystal material on Kish graphite.

Nucleation: Samples SbGp13, SbGp 22 and SbGp 17 show that GaSb nucleates on Kish graphite and forms triangle-like shaped GaSb platelets due to epitaxial relation with the graphitic surface. Nucleation can be achieved with regular MBE at 300° C. and with MEE (Migration-Enhanced Epitaxy method in MBE) at 200° C. and at 300° C. The material deposited on the Kish graphite is the equivalent of 3 monolayers (ML) of GaSb in each case.

Thin film: Samples SbCp24/26/27/31 show that an almost continuous film of GaSb with nominal thickness 100 nm can be grown on Kish graphite using a two-step growth method (MEE nucleation step at 300° C.+MBE growth at 300-520° C.).

The samples SbGp26/27/31 are grown according to such two-step method (MEE step at low temp+MBE step at higher temp), i.e. Sb base layer was not used for these samples.

| Sample Number | Growth details | Short description of the sample |
|---|---|---|
| SbGp 13 | GaSb thin film: 5 sec (3 ML), Sb flux = 1 × 10^-6, Ga = 0.7 MLs-1, Tc = 300° C. | 3 ML GaSb dep at Tc = 300 C. |
| SbGp 14 | Sb flux predep = 1 × 10^-6, 5 min at Tc = 400° C. GaSb thin film: 5 sec (3 ML), Sb flux = 1 × 10^-6, Ga = 0.7 MLs-1, Tc = 300° C. | |
| SbGp 15 | GaSb thin film: MEE 5 sec (3 ML), Sb flux = 1 × 10^-6, Ga = 0.7 MLs-1, Tc = 300° C. [Open Sb 1.4 sec + Open Ga 1.4 sec + wait 2] × 3 times | 3 ML MEE GaSb dep at Tc = 300 C. |
| SbGp 16 | GaSb thin film: 5 sec (3 ML), Sb flux = 1 × 10^-6, Ga = 0.7 MLs-1, Tc = 350° C. | 3 ML GaSb dep at Tc = 350 C. |
| SbGp 17 | GaSb thin film: MEE 5 sec (3 ML), Sb flux = 1 × 10^-6, Ga = 0.3 MLs-1, Tc = 300° C. [Open Sb 3.4 sec + Open Ga 3.4 sec + wait 2] × 3 times | 3 ML MEE GaSb dep at Tc = 300 C., Ga = 0.3 MLs-1 |
| SbGp 18 | GaSb thin film: MEE 5 sec (3 ML), Sb flux = 6 × 10^-7, Ga = 0.3 MLs-1, Tc = 300° C. [Open Sb 3.4 sec + Open Ga 3.4 sec + wait 2] × 3 times | 3 ML MEE GaSb dep at Tc = 300 C., Ga = 0.3 MLs-1, LOW Sb flux |
| SbGp 19 | GaSb thin film: MEE 5 sec (3 ML), Sb flux = 1.5 × 10^-6, Ga = 0.3 MLs-1, Tc = 300° C. [Open Sb 3.4 sec + Open Ga 3.4 sec + wait 2] × 3 times | 3 ML MEE GaSb dep at Tc = 300 C., Ga = 0.3 MLs-1, High Sb flux |
| SbGp 20 | GaSb thin film: Two temp MEE, Sb flux = 1 × 10^-6, Ga = 0.3 MLs-1, Tc = 300° C. [Open Sb 1.7 sec + Open Ga 1.7 sec + wait 2] × 2 times + Tc = 400° C. [Open Sb 3.4 sec + Open Ga 3.4 sec + wait 2] × 2 times | Two temp MEE: 1 ML at 300 C. and 2 MLs at 400 C. |
| SbGp 21 | GaSb thin film: Two temp MEE, Sb flux = 1 × 10^-6, Ga = 0.3 MLs-1, Tc = 300° C. [Open Sb 1.7 sec + Open Ga 1.7 sec + wait 2] × 2 times + Tc = 375° C. [Open Sb 3.4 sec + Open Ga 3.4 sec + wait 2] × 2 times | Two temp MEE: 1 ML at 300 C. and 2 MLs at 375 C. |
| SbGp 22 | GaSb thin film: MEE 5 sec (3 ML), Sb flux = 1 × 10^-6, Ga = 0.3 MLs-1, Tc = 200° C. [Open Sb 3.4 sec + Open Ga 3.4 sec + wait 2] × 3 times | 3 ML MEE GaSb dep at Tc = 200 C., Ga = 0.3 MLs-1 |
| SbGp 23 | GaSb thin film: MEE 5 sec (3 ML), Sb flux = 1 × 10^-6, Ga = 0.3 MLs-1, Tc = 325° C. [Open Sb 3.4 sec + Open Ga 3.4 sec + wait 2] × 3 times | 3 ML MEE GaSb dep at Tc = 325 C., Ga = 0.3 MLs-1 |
| SbGp 24 | GaSb thin film: 100 nm thick, Sb flux = 1 × 10^-6, Ga = 0.3 MLs-1, Tc = 300° C. [Open Sb 3.4 sec + Open Ga 3.4 sec + wait 2] × 20 times + GaSb 980 sec. | 100 nm GaSb dep at Tc = 300 C., Ga = 0.3 MLs-1 |
| SbGp 25 | GaSb thin film: MEE 5 sec (3 ML), Sb flux = 8 × 10^-7, Ga = 0.1 MLs-1, Tc = 300° C. [Open Sb 3.4 sec + Open Ga 3.4 sec + wait 2] × 9 times | 3 ML MEE GaSb dep at Tc = 300 C., Ga = 0.1 MLs-1 |
| SbGp 26 | GaSb thin film: 100 nm thick, Sb flux = 1 × 10^-6, Ga = 0.3 MLs-1, Tc = 300° C. [Open Sb 3.4 sec + Open Ga 3.4 sec + wait 2] × 30 times + GaSb 980 sec at Tc = 450 C. | 100 nm GaSb dep: 3 nm at Tc = 300 C., 98 nm at Tc = 450 C. |
| SbGp 27 | GaSb thin film: 100 nm thick, Sb flux = 1 × 10^-6, Ga = 0.3 MLs-1, Tc = 300° C. [Open Sb 3.4 sec + Open Ga 3.4 sec + wait 2] × 30 times + 100 sec at Tc = 300 C. + GaSb 800 sec at Tc = 450° C. | 100 nm GaSb dep: 3 nm MEE + 10 nm at Tc = 300 C., 80 nm at Tc = 450 C. |
| SbGp 28 | GaSb_Te thin film: MEE 5 sec (3 ML), Sb flux = 1 × 10^-6, Ga = 0.3 MLs-1, GaTe = 600 C., Tc = 300° C. [Open Sb 3.4 sec + Open Ga and GaTe 3.4 sec + wait 2] × 3 times | |
| SbGp 29 | GaSb_Te thin film: MEE 5 sec (3 ML), Sb flux = 1 × 10^-6, Ga = 0.3 MLs-1, GaTe = 550 C., Tc = 300° C. [Open Sb 3.4 sec + Open Ga and GaTe 3.4 sec + wait 2] × 3 times | |

The invention claimed is:

1. A composition comprising a continuous film on a graphitic substrate, wherein said composition comprises, in the following order,
    (a) a graphitic substrate having a thickness of 20 nm or less,
    (b) a base layer comprising a group III-V compound other than AlN; and
    (c) a film comprising a group III-V compound selected from a binary group III-V compound, a ternary group III-V compound, a quaternary group III-V compound, or a plurality of such compounds in different layers;
    wherein the binary group III-V compound is selected from InAs, GaAs, AlAs, InP, GaP, AlP, InSb, GaSb, and AlSb;
    wherein the ternary group III-V compound is defined by formula XYZ, wherein X is a group III element, Y is a group III or group V element, and Z is a group V element, with the proviso that Y is different than X and Z; and wherein the quaternary group III-V compound consists of elements of Group III and one or more elements of Group V, wherein the elements of Group III in the quaternary group III-V compound are selected from Al, Ga, and In;

with the proviso that the group III-V compound of film (c) is different than the base layer;

and wherein film (c) is grown directly on the base layer.

2. The composition of claim 1, wherein the base layer comprises GaSb, InAs, AsSb, SbBi, Sb, AlAsAb, AlInSb, or InAsSb.

3. The composition of claim 1, wherein film (c) or part of film (c) is doped.

4. The composition of claim 1, wherein the graphitic substrate is on a support.

5. The composition of claim 1, wherein the graphitic substrate is free of grain boundaries.

6. The composition of claim 1, wherein film (c) does not comprise AlN.

7. The composition of claim 1, wherein the base layer does not comprise GaN.

8. The composition of claim 1, wherein film (c) is grown using molecular beam epitaxy (MBE), migration-enhanced epitaxy (MEE), metal organic CVD (MOCVD), atomic layer molecular beam epitaxy (ALMBE), or a combination thereof.

9. The composition of claim 1, wherein the thickness of the base layer and film (c) is at least 250 nm.

10. The composition of claim 1, wherein film (c) comprises a plurality of group III-V compounds in different layers.

11. The composition of claim 1, wherein a lattice mismatch of the base layer is 2.5% or less to that of graphene.

12. A process for preparing the composition of claim 1, the process comprising the steps of:
(I) providing the base layer on said graphitic substrate, said base layer having a lattice mismatch of 2.5% or less to that of graphene; and
(II) contacting said base layer with group III-V elements so as to grow the film comprising the group III-V compound.

13. The process as claimed in claim 12, wherein deposition of the base layer or formation of the film grown epitaxially on the graphitic substrate involves migration-enhanced epitaxy (MEE) followed by atomic layer molecular beam epitaxy (ALMBE), in that order.

14. The process as claimed in claim 12, wherein the base layer, the film, or a combination thereof is grown using molecular beam epitaxy (MBE), migration-enhanced epitaxy (MEE), metal organic CVD (MOCVD), atomic layer molecular beam epitaxy (ALMBE), or a combination thereof.

15. The process as claimed in claim 12, wherein the film is grown using molecular beam epitaxy (MBE), metal organic CVD (MOCVD), or a combination thereof.

* * * * *